United States Patent [19]

Kimura et al.

[11] Patent Number: 5,589,688

[45] Date of Patent: Dec. 31, 1996

[54] INFRARED RADIATION SENSOR

[75] Inventors: Mitsuteru Kimura, 2-56, Shiomidai 3-chome, Shichigahama-cho, Miyagi-gun, Miyagi-ken; Takeshi Kudo, Kanagawa, both of Japan

[73] Assignees: Terumo Kabushiki Kaisha, Tokyo; Mitsuteru Kimura, Miyagi-ken, both of Japan

[21] Appl. No.: 564,428

[22] Filed: Nov. 29, 1995

[30] Foreign Application Priority Data

Nov. 30, 1994 [JP] Japan .................................. 6-296565

[51] Int. Cl.⁶ ........................................................ G01J 5/20
[52] U.S. Cl. ................................ 250/338.4; 250/370.14
[58] Field of Search ........................... 250/338.4, 370.14; 374/121

[56] References Cited

U.S. PATENT DOCUMENTS 5,397,897   3/1995   Komatsu et al. ................... 250/338.4

FOREIGN PATENT DOCUMENTS

| 0279492 | 8/1988 | European Pat. Off. . | |
| 0534424 | 3/1993 | European Pat. Off. . | |
| 618431 | 10/1994 | European Pat. Off. | 374/121 |
| 0664554 | 7/1995 | European Pat. Off. . | |
| 58-131525 | 8/1983 | Japan | 250/338.4 |
| 63-273024 | 11/1988 | Japan | 374/121 |
| 4-186833 | 7/1992 | Japan . | |
| 5-40064 | 2/1993 | Japan . | |
| 5-142039 | 6/1993 | Japan . | |

OTHER PUBLICATIONS

Patent Abstracts of Japan, vol. 016, No. 505 (E–1281), 19 Oct. 1992 & JP–A–04 186833 (Fuji Electric Co Ltd.), 3 Jul. 1992. (English abstract.)

Patent Abstracts of Japan, vol. 017, No. 329 (P–1561), 22 Jun. 1993 & JP–A–05 040064 (Mitsuteru Kimura), 19 Feb. 1993. (English abstract.)

Patent Abstracts of Japan, vol. 017, No. 522 (P–1616), 20 Sep. 1993 & JP–A–05 142039 (Hamamatsu Photonics KK), 8 Jun. 1993. (English abstract.)

M. Suzuki et al., "An Infrared Detector Using Poly–Silicon p–n Junction Diode", *Technical Digest of the 9th Sensor Symposium*, 1990, pp. 71–74.

*Primary Examiner*—Carolyn E. Fields
*Assistant Examiner*—Edward J. Glick
*Attorney, Agent, or Firm*—Burns, Doane, Swecker & Mathis, LLP

[57] ABSTRACT

An infrared radiation sensor of high accuracy is provided which is suitable for a thermometer to be used for effecting noncontacting determination of a temperature of a subject under test, particularly a temperature of a tympanic membrane, by utilizing the temperature characteristics of the saturated current flowing in the reverse direction through a Schottky junction diode. The infrared radiation sensor comprises an n type single crystal area 2 formed in the shape of a thin film by doping a sensor substrate 8 made of p type semiconductor with an n type impurity through the surface of the sensor substrate, a temperature sensor element 1 formed in the n type single crystal area 2, a hollow part 6 formed by removing by electrochemically etching the p type semiconductor from the substantially lower and peripheral parts of the n type single crystal area 2, and a thermally and electrically insulating thin film bridge structure having the n type single crystal area 2 in the shape of a thin film provided with the temperature sensor element 1 carried thereon.

6 Claims, 5 Drawing Sheets

CURRENT-VOLTAGE PRORERTY

TEMPERATURE PROPERTY

INFRARED RADIATION SENSOR

BACKGROUND OF THE INVENTION

1. Field of the Invention

This invention relates to an infrared radiation sensor. More specifically, it relates to an infrared radiation sensor for the noncontacting determination of a temperature of a subject under test, particularly a temperature of a tympanic membrana of an organism.

2. Description of the Prior Art

Heretofore, the practice of effecting transfer of infrared radiation between a temperature sensing part serving as a temperature sensor and a subject under test and determining the temperature of the subject based on a resultant change in temperature of this temperature sensing part has been in vogue. Various proposals aimed at miniaturizing such heat sensitive infrared radiation sensors and imparting exalted sensitivity thereon have been introduced to the art.

The infrared-radiation which can be received is very feeble particularly when the temperature of a given subject is near or below normal room temperature as in the case of the temperature of an organism. In adopting a thermistor type temperature sensing means, therefore, it is necessary to devise how to enlarge the thermistor constant and, at the same time, decrease the thermal capacity of the sensor, and prevent to the fullest possible extent the energy of the received radiation from dispersing.

For the purpose of ensuring acquisition of the latter effect, an infrared radiation sensor of a construction wherein a temperature sensing part is formed on a minute bridge structure part so as to decrease as much as possible the amount of the thermal energy to be lost from the temperature sensing part and the temperature sensing part is provided with a means for airtightly sealing the periphery thereof in a vacuum so as to repress to the fullest possible extent the transfer of heat to the ambient air has been proposed.

The means for sensing infrared radiation utilizes such a principle as that the electric resistance of a film such as of amorphous germanium, amorphous silicon, polycrystalline germanium, or polycrystalline silicon is varied with a temperature and, therefore, fits for miniaturization of a sensor. When this means is adopted, however, the highest thermistor constant (B constant) that is attainable at all is only 3500 K. and the sensitivity, therefore, is not fully satisfactory.

As a means for enhancing the sensitivity relative to an infrared radiation, an infrared radiation sensor using a pn junction diode has been disclosed in JP-A-05-142,039 and in literature (Technical Digest of 9th Sensor Symposium, 1990; pp. 71–74).

This sensor utilizes the temperature characteristics which are obtained by the pn junction diode when this diode is biassed in the forward direction. Of this pn junction diode, the temperature coefficient of forward voltage is −1.6 mV/°C. and the sensitivity is 33 V/W at most. Thus, the diode is still deficient in sensitivity.

In addition, a Schottky junction temperature sensor utilizing the phenomenon that the saturated current which flows in the reverse direction when a voltage is applied to a Schottky junction diode in the reverse direction is largely varied with a temperature has been disclosed (JP-A-05-40,064).

The Schottky junction temperature sensor of this nature has a high equivalent thermistor constant of about 7600 K. This fact suggests the possibility of this sensor acquiring more than twice as high sensitivity as the conventional thermistor type infrared radiation sensor.

The Schottky junction diode is encased in a single crystal silicon chip and is not furnished with any special measure for thermal insulation. It, therefore, entails the problem that it has a too large thermal capacity to be effectively heated by feeble infrared radiation.

When polycrystalline or amorphous silicon is used as the material for the Schottky junction diode, this Schottky junction diode still falls short of perfectly forming a highly sensitive infrared radiation sensor because the leak current apparently originating in a crystal defect is large and the change of the current due to a change in temperature is proportionately small.

As a means for forming a single crystal silicon faithfully in a designed shape on a bridge structure part, a method for forming a floating single crystal thin film has been disclosed (JP-A-04-186,833). This method makes use of the p+ etch stop technique which resides in diffusing boron (B) at a high concentration in silicon for allowing single crystal silicon to remain on the bridge structure part. This technique necessitates provision of an etch stop protecting area by encircling an n type silicon part forming an element with a p type silicon. The provision of the etch stop protecting area renders difficult the formation of a bridge structure part with a minute thin film.

An object of this invention, therefore, is to provide a novel infrared radiation sensor.

Another object of this invention is to provide an infrared radiation sensor of high accuracy suitable for a thermometer to be used for the noncontacting determination of a temperature of a subject under test, particularly a temperature of a tympanic membrana of an organism, by utilizing the temperature characteristics of the saturated current of the Schottky junction diode in the reverse direction.

Yet another object of this invention is to provide an infrared radiation sensor suitable for a thermometer to be used for the noncontacting determination of a temperature of a subject under test by utilizing a temperature sensor, particularly a Schottky barrier thermistor, formed in an n type single crystal area of a semiconductor supported on a minute bridge structure part formed of a thermally and electrically insulating thin film.

SUMMARY OF THE INVENTION

The objects mentioned above are accomplished by a heat sensitive infrared radiation sensor possessed of a light receiving part of a bridge structure part, which comprises an n type single crystal area formed in the shape of a thin film by doping a sensor substrate made of a p type semiconductor with an n type impurity through the surface of the sensor substrate, a temperature sensor formed in the n type single crystal area, a hollow part formed by so removing by etching the p type semiconductor from the substantially lower and peripheral parts of the n type single crystal area as to leave the n type single crystal area of the sensor substrate, a thermally and electrically insulating thin film having the n type single crystal area in the shape of a thin film provided with the temperature sensor carried thereon, and a bridge structure part formed over the hollow part.

This invention also concerns the infrared radiation sensor, wherein the temperature sensor is formed as a Schottky barrier thermistor. This invention also concerns the infrared radiation sensor, wherein the n type single crystal area has a film thickness in the range of 0.05 to 15 μm. This invention also concerns the infrared radiation sensor, wherein the bridge structure part has a width in the range of 3 to 30 μm and a thickness in the range of 2 to 5 μm. This invention further concerns the infrared radiation sensor, wherein the bridge structure part is composed of four arms. This invention further concerns the infrared radiation sensor, wherein the ratio L:D is in the range of 1:0.1 to 1:0.9, providing that D stands for the diameter (mm) of the light receiving part and L for the overhanging length (mm) of the bridge structure part.

The infrared radiation sensor according to this invention is a heat sensitive infrared radiation sensor possessed of a light receiving part of a bridge structure part, which comprises an n type single crystal area formed in the shape of a thin film by doping a sensor substrate made of a p type semiconductor with an n type impurity through the surface of the sensor substrate, a temperature sensor formed in the n type single crystal area, a hollow part formed by so removing by etching the p type semiconductor from the substantially lower and peripheral parts of the n type single crystal area as to leave the n type single crystal area of the sensor substrate, a thermally and electrically insulating thin film having the n type single crystal area in the shape of a thin film provided with the temperature sensor carried thereon, and a bridge structure part formed over the hollow part. Thus, it allows manufacture of an infrared radiation sensor capable of quick and highly accurate operation and suitable for a thermometer which is to be used for the noncontacting determination of a temperature of a subject under test, particularly a temperature of a tympanic membrane of an organism, by utilizing the temperature characteristics of the saturated current generated by a Schottky junction diode in the reverse direction.

It further allows manufacture of an infrared radiation sensor suitable for a thermometer which is to be used for the noncontacting determination of a temperature of a subject under test (particularly, a temperature of a tympanic membrana of an organism) by utilizing a temperature sensor, particularly a Schottky barrier thermistor, formed in an n type single crystal area of a semiconductor supported by a minute bridge structure part formed of a thermally and electrically insulating thin film.

By setting the film thickness of the n type single crystal area at a level in the range of 0.05 to 15 μm, an infrared radiation sensor capable of quick and highly accurate operation and suitable for a thermometer for the noncontacting determination of a temperature of a subject under test (particularly, a temperature of a tympanic membrana of an organism) can be obtained.

By adjusting the width of the bridge structure part in the range of 3 to 30 μm and the thickness thereof in the range of 2 to 5 μm, an infrared radiation sensor capable of quicker and more highly accurate operation and more suitably used for a thermometer for the noncontacting determination of a temperature of a subject under test (particularly, a temperature of a tympanic membrana of an organism) can be further obtained.

By forming the bridge structure part with four arms, an infrared radiation sensor capable of quicker and more highly accurate operation and more suitably used for a thermometer for the noncontacting determination of a temperature of a subject under test (particularly, a temperature of a tympanic membrana of an organism) can be obtained.

By setting the ratio L:D in the range of 1:0.1 to 1:0.9, wherein D stands for the diameter (mm) of the light receiving part and L for the overhanging length (mm) of the bridge structure part, an infrared radiation sensor capable of extremely quick and highly accurate operation and satisfactorily suitable for a thermometer to be used for the noncontacting determination of a temperature of a subject under test (particularly, a temperature of a tympanic membrana of an organism) can be obtained.

DESCRIPTION OF PREFERRED EMBODIMENT

Figure 1:
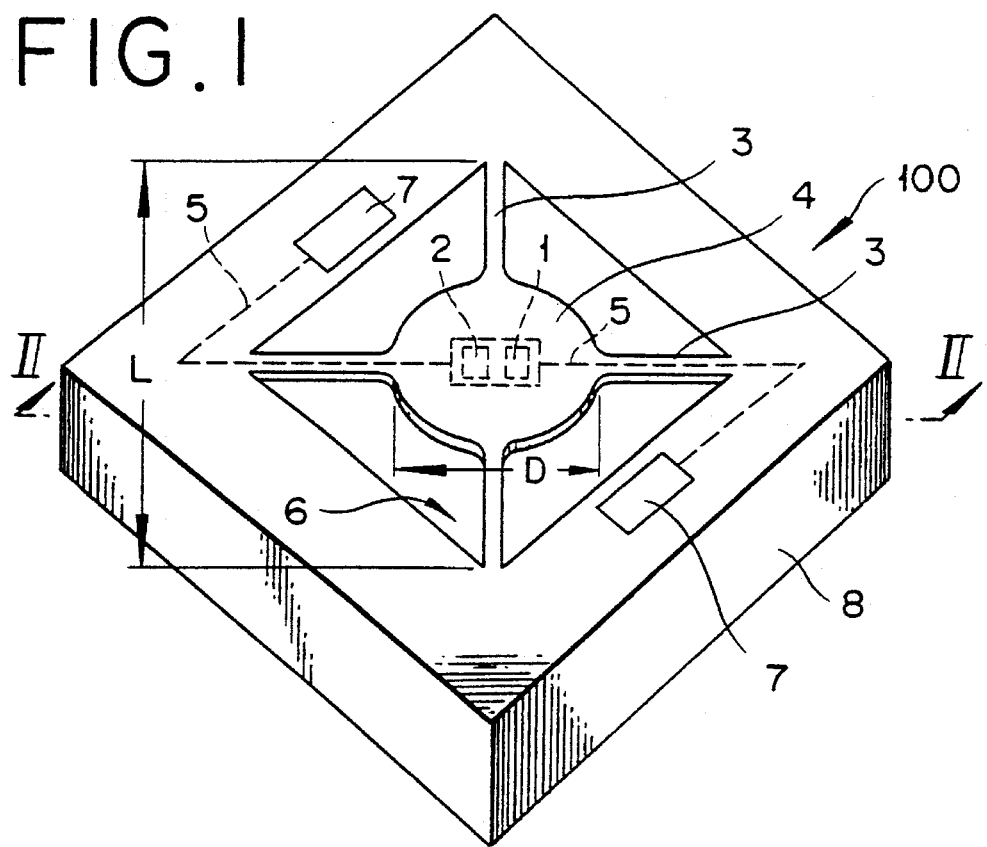
FIG. 1 is an outline diagram showing an infrared radiation sensor as one embodiment of this invention.

In a preferred embodiment of this invention, the n type single crystal area has a film thickness in the range of 0.05 to 15 μm, preferably 0.05 to 2 μm.

In a preferred embodiment of this invention, the bridge structure part has a width in the range of 2 to 30 μm, preferably 2 to 10 μm, and a thickness in the range of 2 to 5 μm, preferably 2 to 3 μm.

In a preferred embodiment of this invention, the bridge structure part is formed with four arms.

In a preferred embodiment of this invention, the ratio L:D is in the range of 1:0.1 to 1:0.9, preferably 1:0.5 to 1:0.7, wherein D stands for the diameter (mm) of the light receiving part and L for the overhanging length (mm) of the bridge structure part.

In the heat sensitive infrared radiation sensor which is provided with the light receiving part of the bridge structure part, the sensor substrate formed of the p type semiconductor is doped with the n type impurity as by diffusion or ion injection through the surface thereof to form the n type single crystal area of the shape in a thin film preparatorily.

The temperature sensor such as of a Schottky barrier thermistor is provided in this n type single crystal area. In the sensor substrate, the p type semiconductor is removed by electrochemically etching from the lower and peripheral parts of the n type single crystal area to form a hollow part. The bridge structure part formed of an electrically and thermally insulating thin film and adapted to support the n type single crystal area is laid across the cavity of the hollow part.

The electrochemical etching for the formation of the bridge structure may remove the p type semiconductor both from the upper and the lower surface of the sensor substrate or may effect this removal only from the upper surface of the sensor substrate which is destined to form the bridge structure part thereon.

The p type semiconductor in the lower and peripheral parts of the n type single crystal area forming the temperature sensor is removed by etching so that no p type semiconductor remains beneath the bridge structure part supporting the temperature sensor thereon. Since the n type single crystal area forming the temperature sensor is supported solely by the bridge structure part formed of the electrically and thermally insulating thin film, it is effective in establishing electric and thermal insulation between the temperature sensor and the sensor substrate.

The electrical connection of the temperature sensor to an external device is attained through the medium of an electric wire provided on the bridge structure part. This electric wire is formed of a conductor in the shape of a thin film for the purpose of decreasing as much as possible the volume of heat to be transmitted therethrough.

In the infrared radiation sensor of this invention, the hollow part is formed in the sensor substrate, the bridge structure part is laid across the cavity of the hollow part, and the n type single crystal area is formed near the center of the bridge structure part. As the sensor substrate, single crystal substrates such as of silicon and germanium are usable. A p type single crystal silicon substrate which can be procured easily and inexpensively is preferably used.

As the examples of the structure for supporting the n type single crystal area, a bridge structure having the opposite ends thereof supported, a cantilever type structure, or a diaphragm type structure may be cited. In order for this structure to be capable of providing ideal thermal insulation between itself and the sensor substrate, lowering the thermal capacity thereof, and conferring mechanical stability thereon, a bridge structure part which is so shaped as to support the light receiving part in the shape of a thin film with four arms may be advantageously used.

The bridge structure part may be formed of a silicon oxide film, a silicone nitride film, a film obtained by superposing these films, or a silicone oxynitride film, for example. It is particularly proper to form the bridge structure part with a silicone oxynitride film.

The silicon oxynitride film has the qualities of both a silicon oxide film and a silicon nitride film, enjoys ideal stress balance consequently, and permits the formation of a stable bridge structure part.

Figure 2:
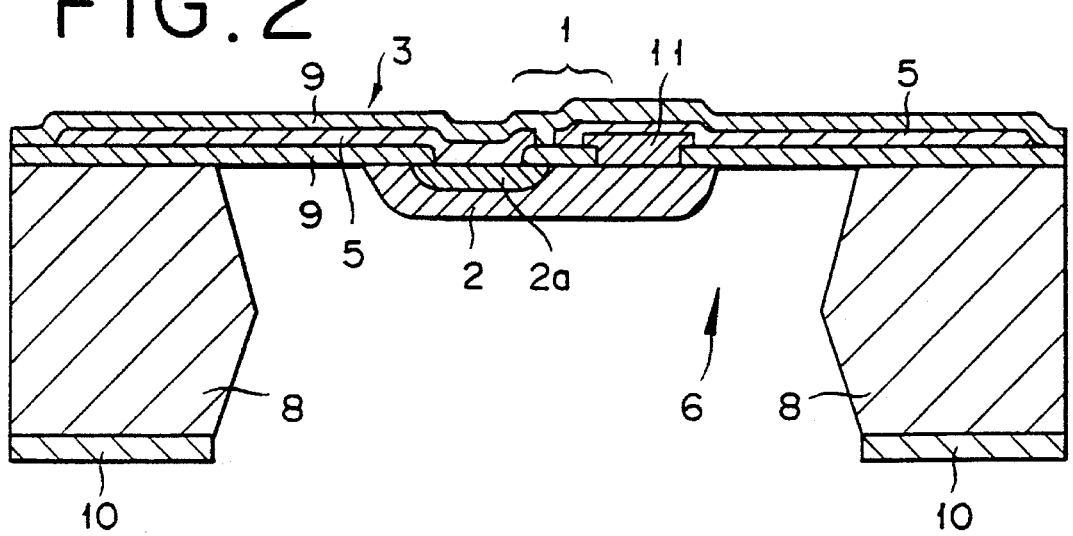
FIG. 2 is a cross-sectional structural diagram of the infrared radiation sensor of the embodiment of this invention, taken through FIG. 1 along the line II—II.

Now, one embodiment of this invention will be described in detail below with reference to the accompanying drawings. FIG. 1 is a perspective view showing the appearance of an infrared radiation sensor 100 according to this invention. FIG. 2 is a cross section taken through FIG. 1 across the line II—II.

In the infrared radiation sensor 100 of this embodiment, a sensor substrate 8 uses a p type single crystal silicon chip and a hollow part 6 is formed in the sensor substrate 8. The hollow part 6 is opened from the upper side to the lower side of the silicon substrate 8. On the upper side of the silicon substrate 8, a bridge structure part 3 including silicon oxynitride films 9 is laid across the cavity of the hollow part 6.

As respects the size of the bridge structure part 3 (the length of the diagonal of the hollow part 6), this part 3 is given an overhanging length of 1.4 mm from the viewpoint of miniaturizing the sensor and enhancing the thermal insulating property of the temperature sensor.

An n type single crystal area 2 in the shape of a thin film (thickness: 0.05 to 15 μm) is provided near the center of the bridge structure part 3 and a temperature sensor 1 is formed in the n type single crystal area 2. As the temperature sensor 1, it is appropriate to use a Schottky barrier thermistor which is formed of a Schottky junction diode utilizing the Schottky junction between the n type single crystal area 2 and a metallic material 11.

To this Schottky barrier thermistor are electrically connected a pair of electric wires 5 made of aluminum. The Schottky barrier thermistor is connected through the medium of the electric wires to a contact pad 7 which is formed on the upper surface of the sensor substrate.

For the metallic material 11 mentioned above, various metals such as Mo, Ti, Ni, Cr, and Pt are available. Among other metals mentioned above, Mo is used particularly advantageously for the purpose of enabling the Schottky barrier thermistor to obtain a reverse current of a suitable magnitude at the temperature aimed at by the determination.

This invention, for the purpose of decreasing as much as possible the amount of the heat to be exchanged between the temperature sensor 1 and the sensor substrate 8, requires the temperature sensor 1 to be provided in the bridge structure part 3. For the purpose of enlarging an area for receiving infrared radiation and increasing as much as possible the amount of change in temperature of the temperature sensor 1, the general central part of the bridge structure part 3 is enlarged in width to give rise to a light receiving part 4 as shown in FIG. 1.

The amount of temperature increased and the time constant of temperature increased in the central part of the bridge structure part 3, i.e. the part in which the temperature sensor 1 is provided, have a close relationship with the ratio of the size of the light receiving part to the overhanging length L of the bridge structure part 3.

In this embodiment, the light receiving part 4 is formed in a practically circular shape and the diameter D of the light receiving part 4 is set at 0.6 mm relative to the specific value 1.4 mm of the overhanging length L of the bridge structure part 3 in consideration with the results of simulation of the amount of temperature increased and the time constant of temperature increased in the central part of the bridge structure part 3 relative to the ratio mentioned above.

It is appropriate for these reasons given above to fix the ratio of L:D in the range of 1:0.1 to 1:0.9, preferably 1:0.7 to 1:0.3.

Further, for the purpose of decreasing as much as possible the amount of the heat transmitted through the bridge structure part 3, the bridge structure part 3 serving to support the n type single crystal area 2 is formed in an extremely small shape (3 to 30 μm in width and 2 to 5 μm in thickness). For the sake of enabling the n type single crystal area 2 to secure thermal insulation from the sensor substrate 8, it is important that the n type single crystal area 2 be substantially supported solely on the bridge structure part 3 made of a thermally and electrically insulating thin film and not supported on a silicon chip which is a good heat conductor.

Appropriately for the purpose of minimizing heat conduction, the electric wire 5 issuing from the Schottky barrier thermistor has a small width and a small thickness. The electric resistance of the electric wire 5 is only required to be amply small as compared with the impedance of the temperature sensor 1.

In this embodiment, therefore, the electric wire 5 of aluminum approximately measuring 5 μm in width and 0.1 μm in thickness is formed along the upper side of the bridge structure part 3 formed of the silicon oxynitride film 9 and measuring about 20 μm in width.

For the purpose of protecting the temperature sensor 1 and the electric wire 5 against the etching liquid used for etching the sensor substrate 8 and forming the hollow part 6 therein, the upper surface of the electric wire 5 which has been formed is substantially wholly protected with the silicon oxynitride film 9 having a thickness of about 3 μm.

Now, the method for producing the infrared radiation sensor of this invention will be described below with reference to FIGS. 3A through 3I which show sequentially the component steps of the process involved.

Figure 3A:
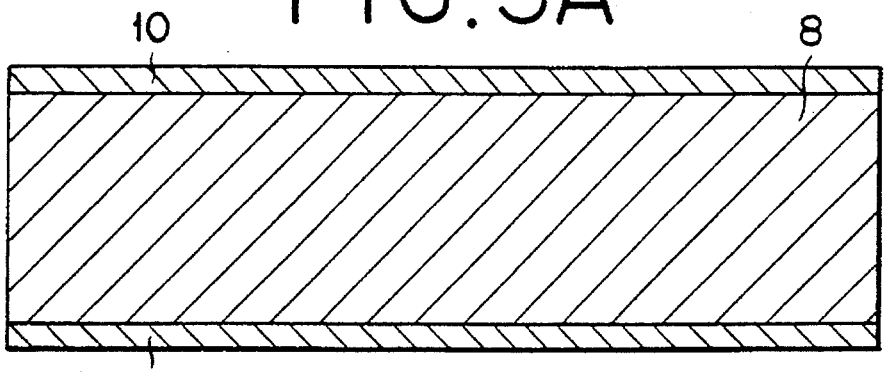
FIG. 3(A–I) are a diagram showing the steps of a process for the production of the infrared radiation sensor of the embodiment of this invention.

A sensor substrate 8 used herein is made of p type single crystal silicon containing boron at an extremely low concentration and exhibiting resistivity of more than 100 Ω.cm, formed in a thickness of about 300 μm, and adapted to form plane orientation of (100). This sensor substrate 8 is subjected to thermal oxidation in an ambience of steam at 1100° C. for 60 minutes to form a silicon oxide film 10 with a thickness of 0.6 μm each on the upper and lower surfaces of the sensor substrate 8 (FIG. 3A).

Figure 3B:
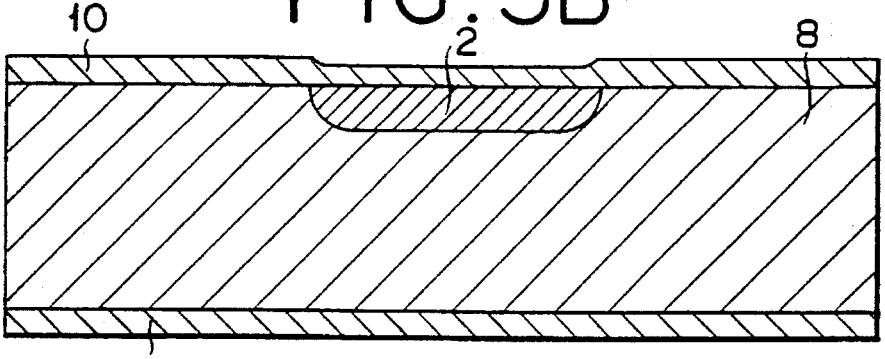

The part of the silicon oxide film 10 destined to form a temperature sensor 1 of the infrared radiation sensor 100 is etched to expose the p type single crystal silicon. Through the removed part of the silicon oxide film 10 as a window, the exposed p type single crystal silicon is doped with phosphorus (P) by ion injection until a phosphorus concentration of not more than $1\times10^{17}$ cm$^{-3}$. For the purpose of forming a Schottky barrier thermistor infallibly, it is important that the doping with the n type impurity be prevented from proceeding to the extent of inducing conversion of the p type single crystal silicon to the n type. The use of the ion injection technique which allows accurate control of the amount of impurity, therefore, proves most advantageous (FIG. 3B).

Further, in the drive-in step, phosphorus is diffused to a depth of several μms to give rise to an n type single crystal area 2 in the shape of a thin film. This n type single crystal area 2 is the part which will be separated from the sensor substrate 8 by the etching given to the sensor substrate 8 and supported by a bridge structure part 3 capable of thermal and electrical insulation.

From the viewpoint of precluding heat conduction from a temperature sensing part and enhancing the sensitivity of the temperature sensor 1, this n type single crystal area 2 is made of a material having thermal insulation or thermal conductivity of less than 0.3 J/s/cm/K, preferably less than 0.15 J/s/cm/K.

Figure 3C:
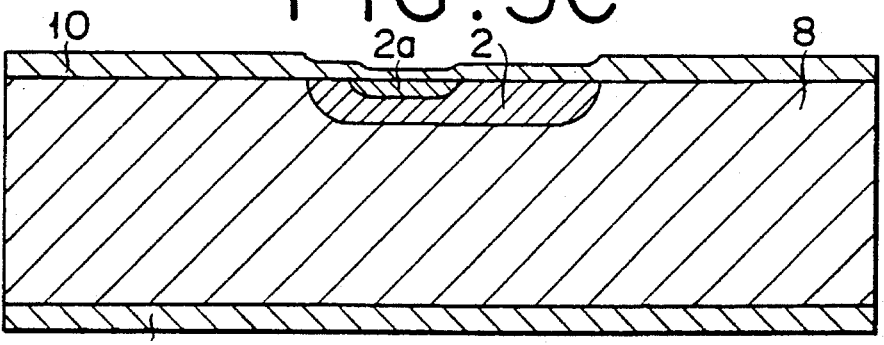

The material has electrical insulation or resistivity of not less than $1\times10^{10}$ Ω.cm, preferably not less than $1\times10^{14}$ Ω.cm. Phosphorus is further diffused in part of the n type single crystal area 2 until a concentration of not less than $1\times10^{20}$ cm$^{-3}$ to give rise to an n type area 2a which will, as a cathode electrode of the Schottky barrier thermistor, serve to establish an ohmic contact with the electric wire of aluminum (FIG. 3C).

The silicon oxide film 10 formed during the drive-in step of phosphorus on the upper surface of the sensor substrate 8 is removed in substantially the entire area. Then, a silicon oxynitride film 9 is formed by the plasma vapor-phase film forming technique (CVD) on the upper surface of the sensor substrate 8.

Figure 3D:
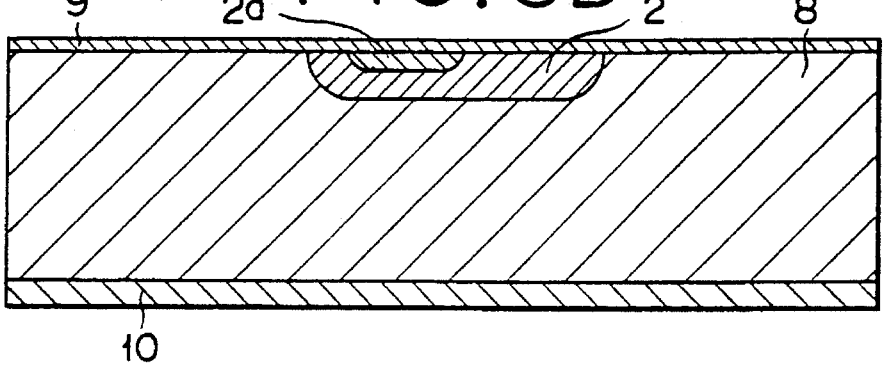

SiH$_4$, NH$_3$, and N$_2$O are used as raw material gases and the silicon oxynitride film 9 is formed in a thickness of about 1 μm. The produced silicon oxynitride film 9 is annealed in an ambience of nitrogen to acquire exalted strength (FIG. 3D).

A contact hole is formed in the silicon oxynitride film 9 on the n type single crystal area 2 and molybdenum (Mo) as a metallic material is deposited in the shape of a thin film of 50 nm in thickness by sputtering on the inner wall of the contact hole. The produced molybdenum film is sintered by way of a calcining treatment in an ambience of nitrogen.

Figure 3E:
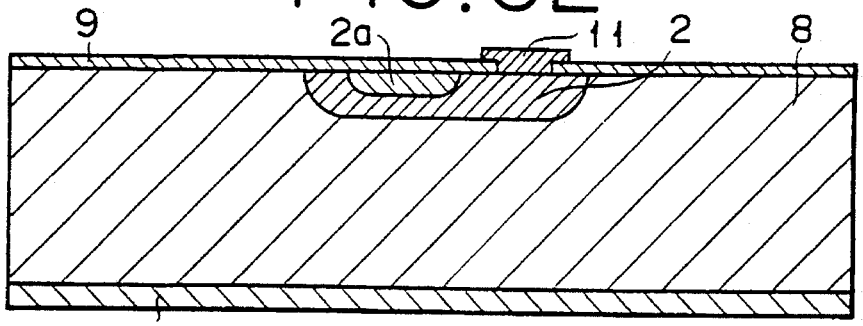

The Mo film other than a Mo part 11 which is necessary for covering the contact hole is removed by etching (FIG. 3E).

A contact hole is formed in the silicon oxynitride film 9 on the n type area 2a and aluminum destined to form an electric wire 5 is deposited in the shape of a thin film by sputtering on the inner wall of the contact hole.

The thickness of the aluminum film is set as 0.1 μm. The produced aluminum film is subjected to a step of photolithography and a step for the removal of aluminum by etching to give rise to the electric wire 5 having a width of 5 μm.

Figure 3F:
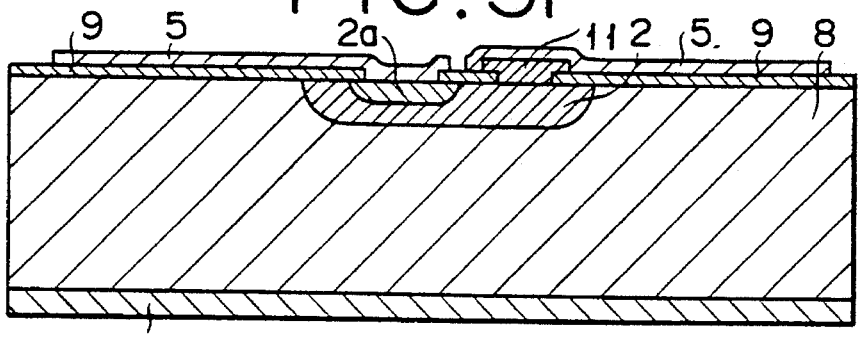

Thereafter, the formed aluminium film is sintered (by way of a calcining treatment) in an ambience of nitrogen to allow creation of an ohmic contact between the n type area 2a and aluminum (FIG. 3F).

For the purpose of protecting the temperature sensor 1 and the electric wire 5 against the etching liquid to be used for the etching, the upper surface of the sensor substrate 8 is coated substantially wholly with the silicon oxynitride film 9.

Figure 3G:
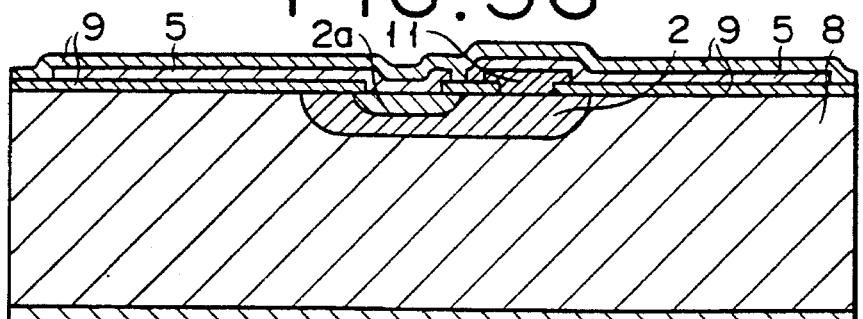

The raw material gases are SiH$_4$, NH$_3$, and N$_2$O and the silicon oxynitride film 9 is formed as a protecting film in a thickness of about 3 μm (FIG. 3G).

Figure 3H:
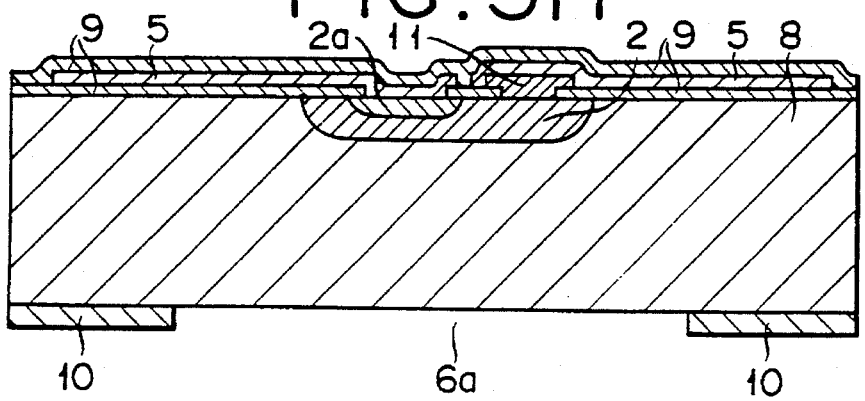

In the pattern of the bridge structure part 3 on the upper surface of the sensor substrate 8 and in the pattern of the silicon etching window on the lower surface of the sensor substrate 8, the silicon oxynitride film 9 and the silicon oxide film 10 are removed by etching to give rise to etching opening parts 6a (FIG. 3H).

By forming opening parts for etching silicon in the upper and lower surfaces of the sensor substrate 8 as described above, the etching is enabled to proceed at an increased rate and completed in a shorter duration. It is nevertheless allowable to form the pattern of the etching opening part only on the practical upper surface of the sensor substrate 8 and etch the sensor substrate 8 only through the practical upper surface to give rise to the bridge structure part 3. The latter procedure is at an advantage in obviating the necessity for treating the lower surface of the sensor substrate 8 and, as a result, simplifying the process of manufacture.

Figure 3I:
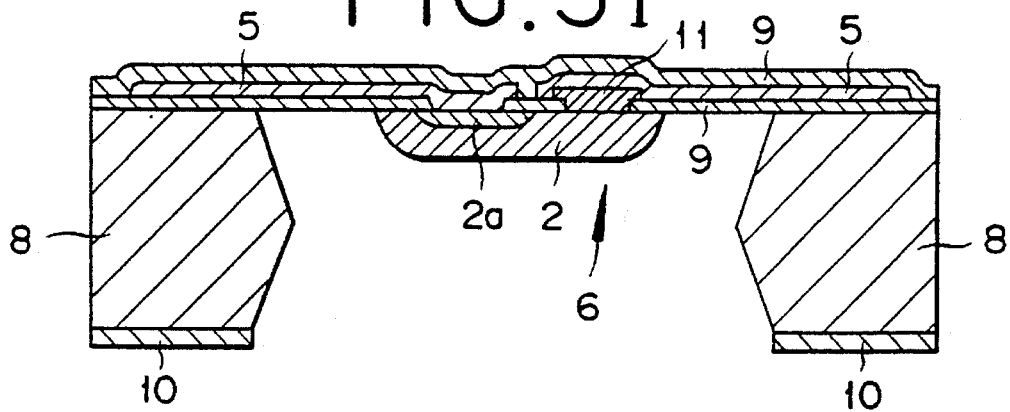

The bridge structure part 3 is formed by immersing the sensor substrate 8 in an alkaline etching liquid and inducing removal of excess silicon. As concrete examples of the etching liquid which is usable herein, hydrazine solution, TMAH, and electroconductive alkaline reagents may be cited. In this embodiment, the hydrazine solution is used because it obtains a clean etched surface (FIG. 3I).

Figure 4:
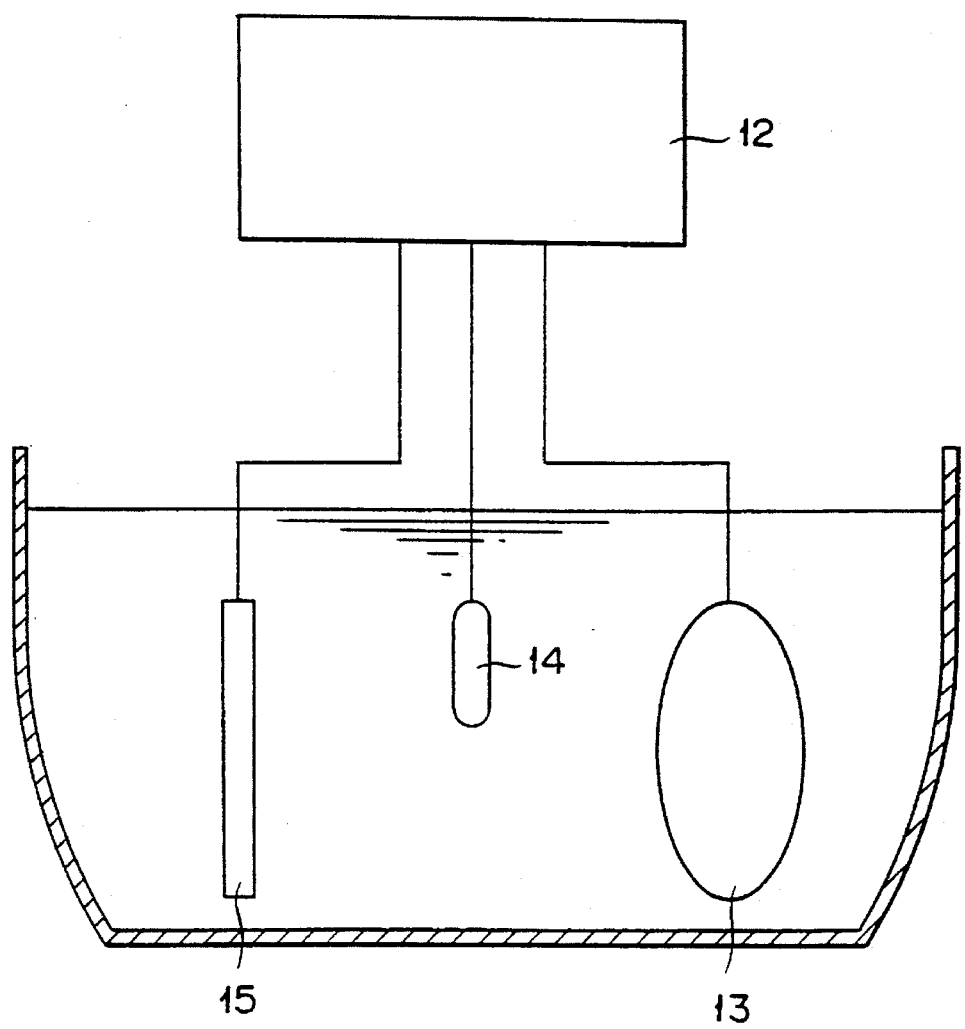
FIG. 4 is a diagram illustrating a method for etching a sensor substrate in the process for the production of the infrared radiation sensor of this invention.

In this case, for the purpose of remaining substantially only the n type single crystal area 2 on the bridge structure part 3 without being etched, the pn junction etch stop technique which resorts to electrochemical etching is used. Specifically, a potentiostat 12 is installed and a three-electrode structure consisting of a working electrode 13 connected to the n type single crystal area 2 of the sensor substrate 8, a counter electrode 15 made of such a precious metal as platinum, and a standard electrode 14 of a silver/ silver chloride (Ag/AgCl) combination is laid out as shown in FIG. 4. In an aqueous hydrazine solution, a proper voltage for imparting positive potential to the working electrode 13 relative to the standard electrode 14 and the counter electrode 15 is applied.

In accordance with the method described above, the n type single crystal area 2 forming a Schottky barrier thermistor can be made to remain intact on the bridge structure part 3 by causing the etching procedure on the sensor substrate 8 of the p type silicon to be stopped after it has reached the n type single crystal area 2. The etching is performed at a temperature of 117° C. and is completed in about three hours.

This embodiment contemplates forming the n type single crystal area 2 exclusively in the light receiving part 4 which is provided in the generally central part of the bridge structure part 3 thereby permitting complete removal of the silicon underlying the bridge structure part 3 with a narrow width. The temperature sensor 1, therefore, is supported on the sensor substrate solely by the thermally and electrically insulating bridge structure part 3, with the result that the exchange of heat between the temperature sensor 1 and the sensor substrate 8 will be copiously decreased and the sensitivity and the response speed of the infrared radiation sensor 100 will be exalted.

Figure 5:
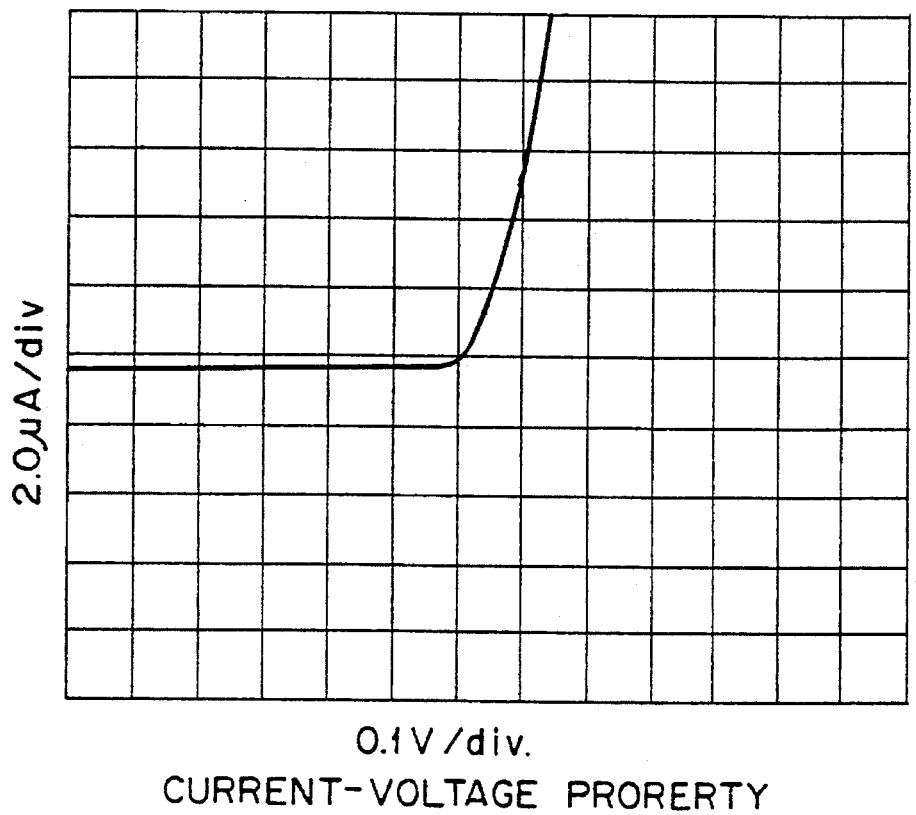
FIG. 5 is a diagram showing the current-voltage characteristics of a Schottky barrier thermistor for the infrared radiation sensor as the embodiment of this invention.

FIG. 5 shows the current-voltage characteristics of the Schottky junction manufactured by this invention. Owing to the use of single crystal silicon, the Schottky junction acquires a perfect characteristic as evinced by a meager leak current in the reverse direction.

Figure 6:
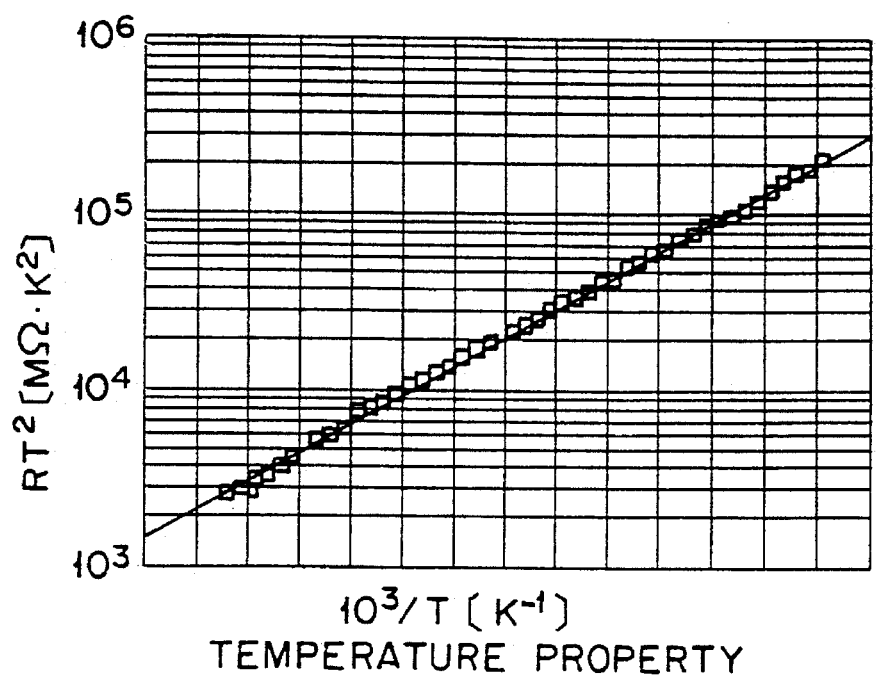
FIG. 6 is a diagram showing the temperature characteristics of the infrared radiation sensor as the embodiment of this invention.

FIG. 6 shows the temperature characteristics of the infrared radiation sensor according to this invention. The data represent the results of the experiment which comprises applying a reverse bias voltage of 0.5 V to the Schottky junction and determining the equivalent thermistor constant based on the change of temperature caused by the current which flows in the reverse direction in response to the applied bias voltage. Owing to the use of single crystal silicon, the produced infrared radiation sensor acquires high sensitivity as evinced by the fact that it registers an equivalent thermistor constant (B constant) of about 7600 K., a value about twice as high as the B constant (about 3500 K.) of the conventional thermistor using germanium or the equivalent B constant (about 4000 K.) of the Schottky junction using polycrystalline silicon.

The embodiment described above is meant to be illustrative of this invention and not limitative of the invention.

The material for the electric wire, for example, need not be limited to aluminum but may be any member selected from the group consisting of aluminum alloys, other metals such as Cr and Ti, and a material obtained by superposing such alloys and metals. A metallic material selected among Ni, Cr, Ti, Pt, etc. may be used for the formation of a Schottky barrier thermistor, depending on the temperature which is aimed at by the determination.

It is naturally permissible to form the bridge structure part laid across the cavity of the hollow part and the temperature sensor on the bridge structure part in a substantially identical shape and expose one of them to infrared radiation and shield the other from the infrared radiation so as to obtain a differential output therebetween.

The temperature sensor 1 which has not been exposed to the infrared radiation may be formed on the sensor substrate itself instead of on the bridge structure part and may be used as a standard sensor for obtaining a differential output.

The present embodiment contemplates giving an enlarged width to a part of the bridge structure part and allowing the light receiving part to be provided on the part of enlarged width for the purpose of increasing as much as possible the amount of the infrared radiation to be received. By further covering the surface of the light receiving part with an infrared radiation absorbent such as black gold, for example, the reception or release of infrared radiation between the light receiving part and a subject under test can be implemented more efficiently.

The present embodiment contemplates using a Schottky barrier thermistor as the temperature sensor. This Schottky barrier thermistor may be an ordinary resistant thermistor, a thermistor of the kind utilizing the dependence of the semiconductor on the temperature of the voltage in the forward direction of the pn junction. The principle of the detection of temperature may be freely selected.

When the hollow part is provided with means for retaining the interior thereof under a vacuum (not more than about $10^{-3}$ torr), the sensitivity of the infrared radiation sensor can be further exalted.

What is claimed is:

1. A heat sensitive infrared radiation sensor comprising an n type single crystal area formed in the shape of a thin film by doping a sensor substrate made of p type semiconductor with an n type impurity through the surface of said sensor substrate, a temperature sensor element formed in said n type single crystal area, a hollow part formed by removing by etching said p type semiconductor from the substantially lower and peripheral parts of said n type single crystal area as to leave said n type single crystal area of the sensor substrate, and a thermally and electrically insulating thin film bridge structure part having said n type single crystal area in the shape of a thin film provided with said temperature sensor element carried thereon, said bridge structure part formed over said hollow part and including a light receiving part.

2. An infrared radiation sensor according to claim 1, wherein said temperature sensor element is formed as a Schottky barrier thermistor.

3. An infrared radiation sensor according to claim 1, wherein said n type single crystal area has a film thickness in the range of 0.05 to 15 μm.

4. An infrared radiation sensor according to claim 1, wherein said bridge structure part has a width in the range of 3 to 30 μm and a thickness in the range of 2 to 5 μm.

5. An infrared radiation sensor according to claim 1, wherein said bridge structure part comprises four arms.

6. An infrared radiation sensor according to claim 1, wherein the ratio L:D is in the range of 1:0.1 to 1:0.9, providing that D stands for the diameter (mm) of said light receiving part and L for the overall length (mm) of said bridge structure part.

* * * * *

UNITED STATES PATENT AND TRADEMARK OFFICE
CERTIFICATE OF CORRECTION

PATENT NO. : 5,589,688

DATED : December 31, 1996

INVENTOR(S) : Mitsuteru KIMURA et al

It is certified that error appears in the above-indentified patent and that said Letters Patent is hereby corrected as shown below:

In Column 4, line 16, delete "are a diagram" and insert -- are diagrams --.

Signed and Sealed this

Twenty-fifth Day of March, 1997

Attest:

BRUCE LEHMAN

*Attesting Officer*    *Commissioner of Patents and Trademarks*